United States Patent
Krishnamoorthy et al.

(10) Patent No.: US 12,532,689 B2
(45) Date of Patent: Jan. 20, 2026

(54) METHOD AND APPARATUS FOR CONTROLLING A LIQUID

(71) Applicant: ASM IP Holding B.V., Almere (NL)

(72) Inventors: Harihara Krishnan Krishnamoorthy, Tempe, AZ (US); Eric Jen Cheng Liu, Tempe, AZ (US)

(73) Assignee: ASM IP Holding B.V., Almere (NL)

( * ) Notice: Subject to any disclaimer, the term of this patent is extended or adjusted under 35 U.S.C. 154(b) by 80 days.

(21) Appl. No.: 17/942,244

(22) Filed: Sep. 12, 2022

(65) Prior Publication Data
US 2023/0080843 A1 Mar. 16, 2023

Related U.S. Application Data

(60) Provisional application No. 63/244,563, filed on Sep. 15, 2021.

(51) Int. Cl.
*H01L 21/67* (2006.01)
*F15D 1/04* (2006.01)

(52) U.S. Cl.
CPC .......... *H01L 21/67017* (2013.01); *F15D 1/04* (2013.01)

(58) Field of Classification Search
CPC ... H01L 21/67017; F15D 1/04; G01F 23/0007
See application file for complete search history.

(56) References Cited

U.S. PATENT DOCUMENTS

| | | | |
|---|---|---|---|
| 3,607,659 A | 9/1971 | Bloomer | |
| 3,881,640 A | 5/1975 | Noble | |
| 4,213,342 A | 7/1980 | Gates | |
| 6,431,229 B1* | 8/2002 | Birtcher | F17C 13/04 141/67 |
| 6,520,218 B1* | 2/2003 | Gregg | F17C 6/00 141/7 |
| 6,658,933 B2* | 12/2003 | Allegre | G01F 23/2927 73/290 R |
| 6,880,592 B2* | 4/2005 | Gregg | C23C 16/4402 141/286 |
| 6,953,047 B2* | 10/2005 | Birtcher | B67D 7/0272 134/1.2 |
| 7,261,118 B2* | 8/2007 | Birtcher | C23C 16/4481 137/13 |
| 7,370,848 B2 | 5/2008 | Stamp | |
| 7,524,374 B2* | 4/2009 | Chen | H01L 21/76843 118/716 |
| 7,699,295 B2* | 4/2010 | Lee | C23C 16/4482 261/DIG. 65 |
| 7,775,508 B2* | 8/2010 | Choi | C23C 16/4481 261/142 |
| 9,435,027 B2 | 9/2016 | Birtcher | |
| 9,598,766 B2* | 3/2017 | Birtcher | C23C 16/4485 |
| 11,781,221 B2* | 10/2023 | Yednak, III | C23C 16/4583 438/778 |
| 2004/0013577 A1* | 1/2004 | Ganguli | C23C 16/18 422/129 |
| 2008/0149031 A1* | 6/2008 | Chu | C23C 16/4482 118/726 |
| 2020/0066552 A1 | 2/2020 | Susa | |

* cited by examiner

*Primary Examiner* — Reinaldo Sanchez-Medina
(74) *Attorney, Agent, or Firm* — Snell & Wilmer L.L.P.

(57) ABSTRACT

An apparatus capable of controlling a liquid may provide a source vessel to contain the liquid and an inlet tube for flowing the liquid into the source vessel. The inlet tube may extend into the source vessel and may be arranged to direct the flowing liquid onto a sidewall of the source vessel.

13 Claims, 4 Drawing Sheets

METHOD AND APPARATUS FOR CONTROLLING A LIQUID

CROSS-REFERENCE TO RELATED APPLICATIONS

This application is a nonprovisional of, and claims priority to and the benefit of, U.S. Provisional Patent Application No. 63/244,563, filed Sep. 15, 2021 and entitled "METHOD AND APPARATUS FOR CONTROLLING A LIQUID," which is hereby incorporated by reference herein.

FIELD OF INVENTION

The present disclosure generally relates to a method and apparatus for controlling a liquid in a source vessel. More particularly, the present disclosure relates to a system for controlling the flow of a liquid chemical used during the fabrication of semiconductor devices.

BACKGROUND OF THE DISCLOSURE

Source vessels used during the fabrication of semiconductor devices may need to be refilled. Conventional systems provide an inlet tube to flow a liquid into the source vessel to refill the source vessel to a desired level. A sensor, typically arranged within the source vessel, is used to detect the level of the liquid inside the source vessel and is used to determine when the liquid reaches the desired level. During the refill process, however, the incoming liquid may be sprayed directly on the sensor, which causes false sensor readings. In addition, the incoming liquid may splash as it is flowed into the source vessel, which also may cause false sensor readings.

SUMMARY OF THE DISCLOSURE

An apparatus capable of controlling a liquid may provide a source vessel to contain the liquid and an inlet tube for flowing the liquid into the source vessel. The inlet tube may extend into the source vessel and may be arranged to direct the flowing liquid onto a sidewall of the source vessel.

BRIEF DESCRIPTION OF THE DRAWING FIGURES

These and other features, aspects, and advantages of the invention disclosed herein are described below with reference to the drawings of certain embodiments, which are intended to illustrate and not to limit the invention.

FIG. 1 representatively illustrates a system in accordance with an exemplary embodiment of the present technology;

It will be appreciated that elements in the figures are illustrated for simplicity and clarity and have not necessarily been drawn to scale. For example, the relative size of some of the elements in the figures may be exaggerated relative to other elements to help improve understanding of illustrated embodiments of the present disclosure.

DETAILED DESCRIPTION OF EXEMPLARY EMBODIMENTS

Figure 1:
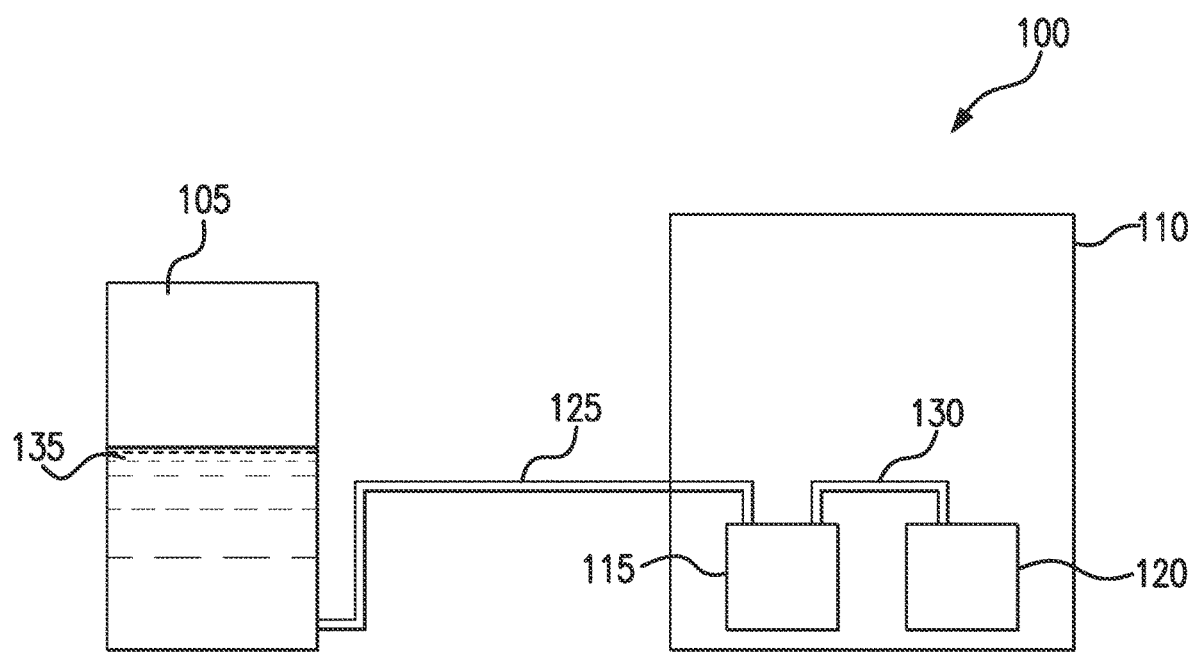

Reference will now be made to the drawings wherein like reference numerals identify similar structural features or aspects of the subject disclosure. For purposes of explanation and illustration, and not limitation, a partial view of an example of semiconductor processing system in accordance with the present disclosure is shown in FIG. 1 and is designated generally by reference character 100. Other examples of semiconductor processing systems in accordance with the present disclosure, or aspects thereof, are provided in FIGS. 2-5, as will be described. The systems and methods of the present disclosure may be used for filling a container, such as filling a source vessel used in semiconductor processing, though the present disclosure is not limited to the filling a source vessel used in semiconductor processing or to filling a container in general.

The description of exemplary embodiments provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of stated features.

The present disclosure generally relates to a system and an apparatus capable of controlling a liquid. In addition, some aspects of the present technology are generally related to an apparatus for containing a liquid.

Referring to FIG. 1, a system 100 may comprise an external bulk container 105 to store a liquid, such as a chemical liquid used in a process for manufacturing a semiconductor device. The external bulk container 105 may be fluidly connected to a tool 110 that houses an apparatus 115 for controlling liquid flow to a reaction chamber 120. For example, the external bulk container 105 may be connected to the apparatus 115 with a first pipe system 125 and the apparatus 115 may be connected to the reaction chamber 120 with a second pipe system 130.

The first pipe system 125 may be configured to flow a liquid chemical 135 from the external bulk container 105 to the apparatus 115 and may comprise any number of pipes, pumps, and/or valves suitable to maintain a desired flow rate.

The second pipe system 130 may be configured to flow a gas or vapor from the apparatus 115 to the reaction chamber 120 and may comprise any number of pipes, pumps, and/or values suitable to maintain a desired flow rate. The gas or vapor flowed into the reaction chamber 120 may be used to deposit a semiconductor film on a wafer disposed within the reaction chamber 120.

Figure 2:
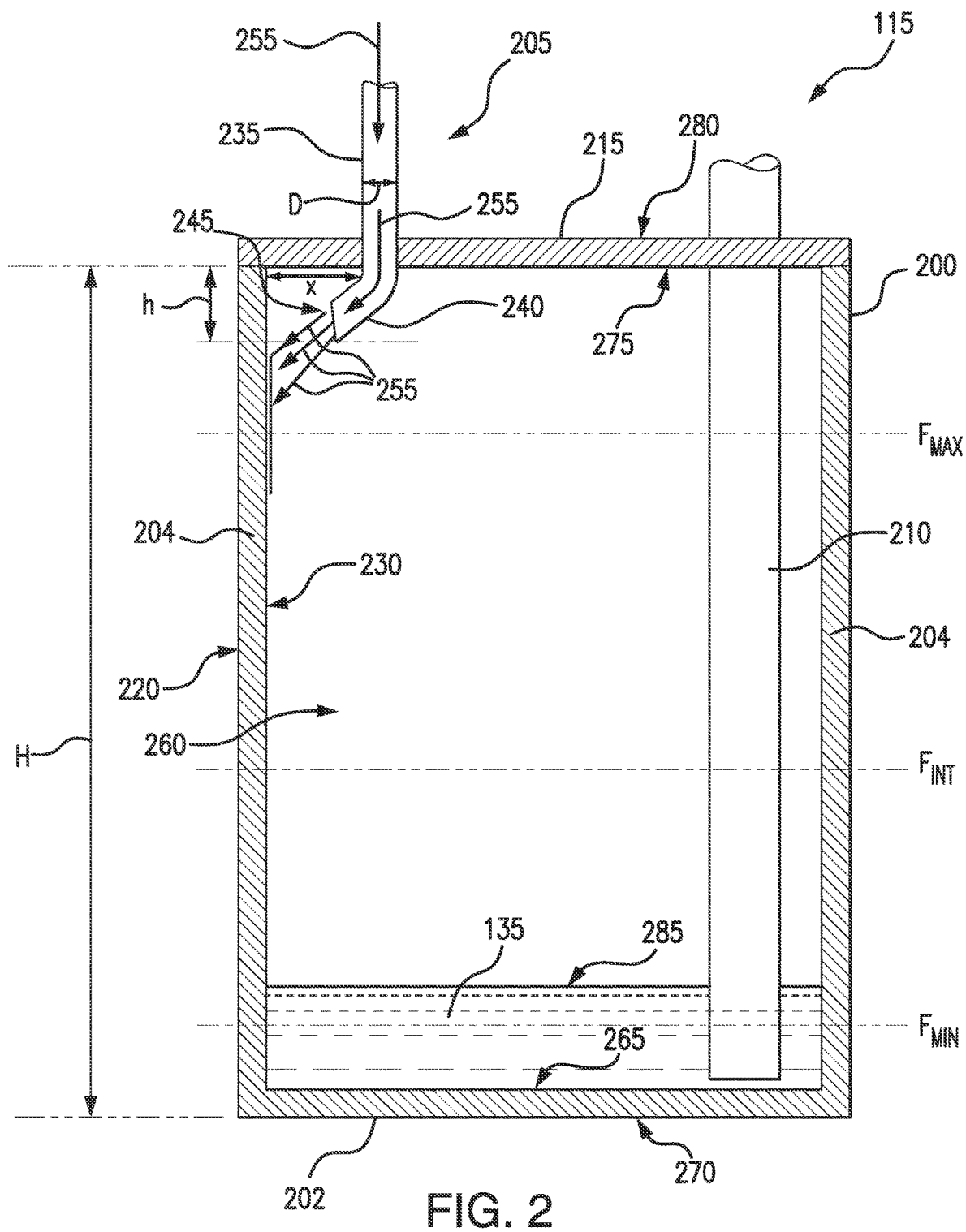
FIG. 2 is a side view of the apparatus for controlling a liquid in accordance with an exemplary embodiment of the present technology.

In an exemplary embodiment, and referring to FIG. 2, the apparatus 115 may comprise a source vessel 200, a lid 215, an inlet tube 205, and a sensor 210.

Figure 3:
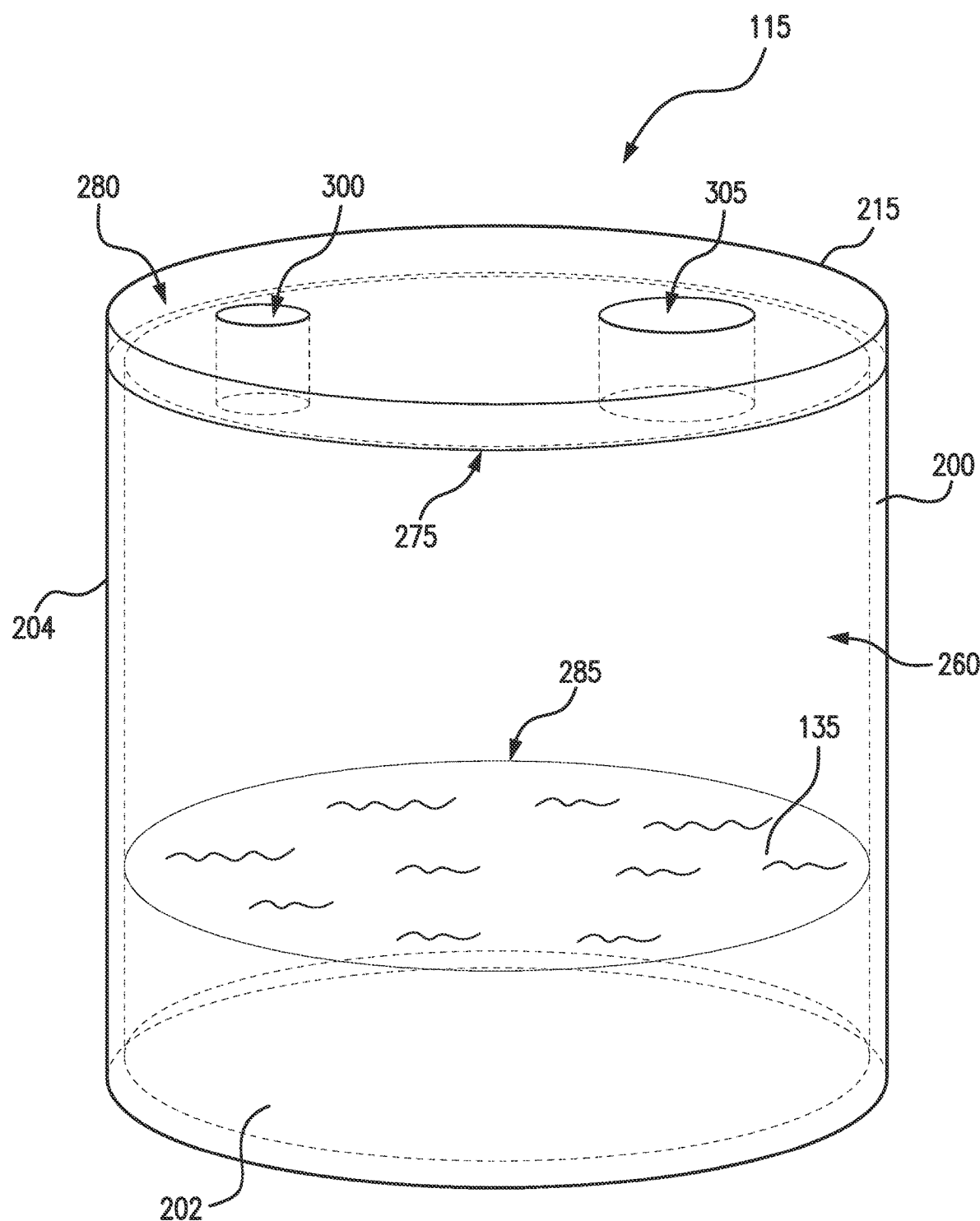
FIG. 3 is a perspective view of a portion of the apparatus for controlling a liquid in accordance with an exemplary embodiment of the present technology.
Figure 4:
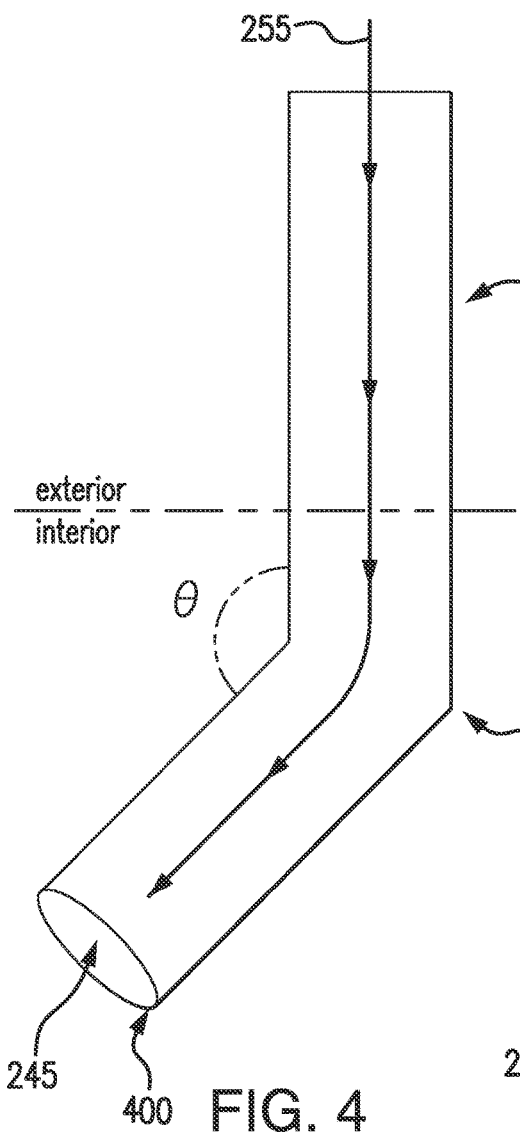
FIG. 4 is a side view of an inlet tube in accordance with an exemplary embodiment of the present technology.
Figure 5:
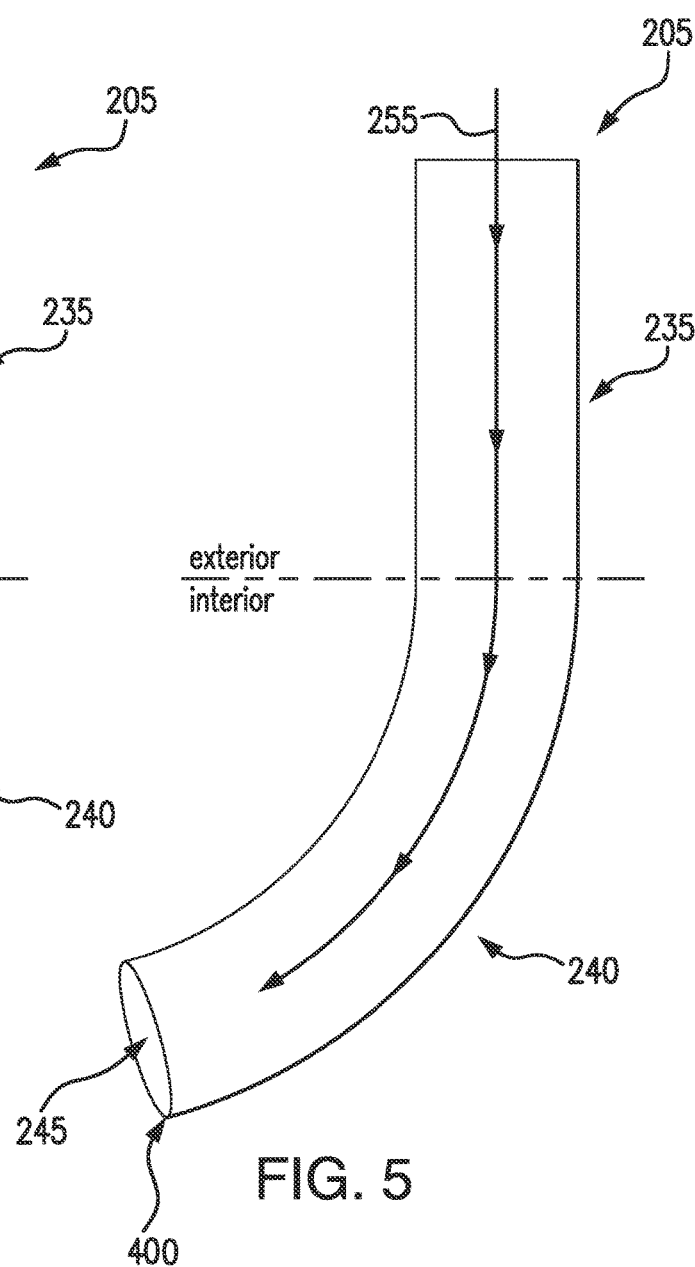
FIG. 5 is a side view of an inlet tube in accordance with an alternative embodiment of the present technology.

The source vessel 200 may be configured to hold or otherwise contain the liquid 135. For example, the source vessel 200 may comprise a bottom panel 202 arranged horizontally. The source vessel 200 may further comprise a sidewall 204 that is connected to or integrated with the bottom panel 202 and extends upwards, in a vertical position, from the bottom panel 202. In other words, the sidewall 204 may be perpendicular to the bottom panel 202. The source vessel 200 may be any suitable shape and size. For example, the source vessel 200 may be a cylinder shape having one continuous sidewall and circular bottom panel (e.g., as illustrated in FIG. 3). Alternatively, the source vessel 200 may be a cube or cuboid shape having four (4) sidewalls and a square or rectangular shape bottom panel.

In one embodiment, the source vessel 200 may be a single, continuous shape. Alternatively, the source vessel 200 may be formed from two or more elements (e.g., the bottom panel 202 may be welded to the sidewall 204). The source vessel 200 may be formed from any material suitable for holding the liquid 135, such as stainless steel 316L or any other suitable material.

The sidewall 204 may comprise an interior-facing surface 230 and an exterior-facing surface 220. Similarly, the bottom panel 202 may comprise an interior-facing surface 265 and an exterior-facing surface 270. The interior-facing surface 265 of the bottom panel 202, the interior-facing surface of the sidewall 204, and the lid 215 may define an interior cavity 260 of the source vessel. The interior cavity 260 may be used to hold the liquid 135.

The lid 215 (also referred to as the top panel) may be configured to close or otherwise seal the source vessel 200. For example, the lid 215 may abut a top edge of the sidewall 204 and may create an air-tight seal with the sidewall 204 of the source vessel 200. For example, the lid 215 may be welded to the sidewall 204 of the source vessel 200. Alternatively, the lid 215 may be integrated with the sidewall 204.

The lid 215 may comprise a first planar surface 275 facing into the interior cavity 260 of the source vessel 200 and a second planar surface 280, opposite the first planar surface 275, facing away from the interior cavity 260 of the source vessel 200. The lid 215 may be arranged parallel to the bottom panel 202 and perpendicular to the sidewall 204.

In various embodiments, and referring to FIG. 3, the lid 215 may further comprise a first through-hole 300 and a second through-hole 305. The first through-hole 300 may be suitably sized to accommodate the inlet tube 205. The second through-hole 305 may be suitably sized to accommodate the sensor 210. In various embodiments, the lid 315 may further comprise various sealing devices and/or materials within the first and second through-holes 300, 305 to prevent air from entering the interior cavity 260 of the source vessel 200 and maintain a desired pressure inside the source vessel 200.

In various embodiments, the lid 215 may further comprise a third through-hole (not shown) suitably sized to accommodate or otherwise attach to the second pipe system 130. The third through-hole may be modified with various sealing devices and/or other materials to prevent air from entering the interior cavity 260 of the source vessel 200 and/or to maintain a desired pressure inside the source vessel 200 and second pipe system 130.

In various embodiments, the inlet tube 205 may be configured to facilitate a flow 255 of the liquid 135 from the external bulk container 105 and/or the first pipe system 125 into the source vessel 200. The inlet tube 205 may comprise any material suitable for flowing the liquid 135, such as stainless steel 316L, Hastelloy or other suitable material, and may have any diameter size. For example, the inlet tube 205 may have a diameter D of ⅜ inch. The diameter of the inlet tube 205 may be selected according to a particular application, desired flow rate, and the like. In various embodiments, the inlet tube 205 extends through the first through-hole 300 and into the interior cavity 260 of the source vessel 200.

The inlet tube 205 may comprise a first portion 235 that extends outside the source vessel 200 and a second portion 240 that extends into the interior cavity 260 of the source vessel 200. In an exemplary embodiment, the first portion 235 may have a linear shape that extends upwards from the lid 205 and may attach to the first pipe system 125. Alternatively, the first portion 235 may have a non-linear shape extending upwards and/or away from the lid 205.

In various embodiments, the second portion 240 may have a non-linear shape. For example, and referring to FIG. 4, the second portion 240 may have a curved shape having a radius of curvature R in a range of 1.9 to 4.5 centimeters. In one embodiment, the inlet tube 205 may have a diameter of ⅜ inch with the second portion 240 having a bend radius of 2.38 cm. Alternatively, the second portion 240 may have a bent shape having an angle θ in a range of 90-150 degrees. The second portion 240 of the inlet tube 205 may have any non-linear shape suitable for directing the flow of the liquid 255 toward the sidewall 204, and more specifically, away from the sensor 210. Accordingly, an opening 245 of the inlet tube 205 may be facing toward or otherwise pointing toward the sidewall 204. In other words, the opening 245 of the inlet tube 205 may be pointing in a lateral direction, rather than in a downward direction toward the bottom panel 202. Moreover, the second portion 240 of the inlet tube 205 may be arranged to prevent the liquid from flowing directly to the bottom of the interior cavity 260, because flowing the liquid directly to the bottom of the interior cavity 260 may result in the liquid splashing onto the sensor 210 as it reaches the bottom of the interior cavity 260.

The particular degree of the bend θ or the radius of curvature R may be selected to ensure that the liquid 135 flows onto the sidewall 204 and not straight down. For example, in various embodiments, the particular degree of the bend θ or the radius of curvature R may be selected according to various factors that may affect the flow of the liquid 135 out of the inlet tube 205, such as the dimensions of the inlet tube 205 (e.g., the length and diameter of the inlet tube 205), the dimensions of the source vessel 200, the flow rate of the liquid 135, and/or a distance x of the inlet tube 205 to the sidewall 204. For example, as the distance x of the inlet tube 205 to the sidewall 204 increases, the degree of the bend θ or the radius of curvature R may also increase to ensure that the liquid 135 flows onto the sidewall 204 and not straight down.

In various embodiments, the inlet tube 205 extends into the interior cavity from the lid 215 by a distance h (measured in centimeters), where the distance h is selected according to a total height H (measured in centimeters, where H is a height of the sidewall 204 of the source vessel 200). For example, the distance h may be selected based on a percentage of the total height H, where the distance h may be in a range of 20-40% of total height H. For example, if the total height H is 100 cm, then the inlet tube 205 may extend into the interior cavity 260 by a distance h of 20 cm to 40 cm from the lid 215. In particular, the distance h is measured from the lid 215 to a lower-most boundary 400 (FIG. 4) of the opening 245 of the inlet tube 205.

The sensor 210 may be configured to detect a liquid level in the interior cavity 260 of the source vessel 200 during a refill process or during a normal operation of the system 100. For example, the sensor 210 may be able to detect when a surface 285 of the liquid 135 (i.e., liquid level) reaches a maximum fill level $F_{MAX}$, when the liquid level reaches a minimum fill level $F_{MIN}$, and/or when the liquid level reaches an intermediate fill level $F_{INT}$. The particular values for the maximum fill level $F_{MAX}$, the intermediate fill level $F_{INT}$, and the minimum fill level $F_{MIN}$ are predetermined and may be selected based on the particular application, the particular size and shape of the source vessel 200, and/or the volume of the source vessel 200.

In various embodiments, the sensor 210 may comprise an ultrasonic sensor, an optical sensor, an infrared sensor, or the like. The sensor 210 may generate an output signal that indicates the level of the liquid 135. The sensor 210 may be connected to and operate in conjunction with a processing system to interpret the output signal and provide an alert or indicator to an operator interface (not shown).

In various embodiments, the opening 245 of the inlet tube 205 is positioned above the maximum fill level $F_{MAX}$. Accordingly, the distance h may be limited based on the maximum fill level $F_{MAX}$. In other words, the greater the maximum fill level $F_{MAX}$, the smaller the range of the distance h.

In operation, and referring to FIGS. 1 and 2, during a refill process, the first pipe system 125 may facilitate flow of the liquid 135 out of the bulk container 105 and into the apparatus 115. Specifically, the first pipe system 125 may facilitate flow of the liquid 135 out of the bulk container 105 and to the inlet tube 205. The liquid 135 may then flow through the inlet tube 205 and into the interior cavity 260 of the source vessel 200. In various embodiments, flowing the liquid 135 into the source vessel 200 comprises flowing the liquid 135 toward the sidewall 204 of the source vessel 200. This flow direction may be achieved by pointing the opening 245 of the inlet tube 205 toward the sidewall 204 and/or providing an inlet tube 205 with a curve or bend, as described above. In various embodiments, flowing the liquid 135 into the source vessel 200 may further comprise flowing the liquid 135 away from the sensor 210.

During the refill process and while the liquid 135 is flowing from the bulk container 105 to the source vessel 200, the sensor 210 may continuously detect the liquid level and output sensor readings indicating the liquid level. Alternatively, the sensor 210 may detect the liquid level and output sensor readings indicating the liquid level on a predetermined interval, such as every 5 seconds. The system 100 may be configured to fill the source vessel 200 to the maximum fill level $F_{MAX}$ during the refill process.

During a normal operation of the tool 110, the sensor 210 may be used to detect decreases in the liquid level. Specifically, the sensor 210 may alert the system 100 that the liquid level is at or near the minimum fill level $F_{MIN}$. At such time, the system 100 may pause operation of the tool 100 and initiate the refill process, as described above.

Although this disclosure has been provided in the context of certain embodiments and examples, it will be understood by those skilled in the art that the disclosure extends beyond the specifically described embodiments to other alternative embodiments and/or uses of the embodiments and obvious modifications and equivalents thereof. In addition, while several variations of the embodiments of the disclosure have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the disclosure. It should be understood that various features and aspects of the disclosed embodiments can be combined with, or substituted for, one another in order to form varying modes of the embodiments of the disclosure. Thus, it is intended that the scope of the disclosure should not be limited by the particular embodiments described above.

The invention claimed is:

1. A method for controlling liquid flow, comprising:
providing a source vessel comprising an inlet tube, a first sidewall, and a sensor configured for sensing a liquid level in the source vessel, wherein the source vessel comprises a maximum fill level and a minimum fill level determined by the sensor, wherein the sensor extends through a through hole in a top panel of the source vessel and into the source vessel below the minimum fill level, wherein the inlet tube comprises a bend with an angle angled toward the first sidewall and configured to dispense a liquid from the inlet tube away from the sensor and onto the first sidewall;
flowing the liquid from a bulk container through a first pipe system to the inlet tube;
flowing the liquid through the inlet tube away from the sensor and onto the first sidewall before reaching a volume of the liquid contained in the source vessel, wherein the liquid does not splash on the sensor while flowing; and
after flowing the liquid, flowing a gas or vapor from the source vessel through a second pipe system.

2. The method of claim 1, wherein the liquid flows onto the first sidewall above the maximum fill level.

3. The method of claim 1, wherein the angle is in a range of 90-150 degrees.

4. The method of claim 1, wherein the sensor is connected to a processing system configured to provide an alert when the liquid level is at the minimum fill level.

5. The method of claim 1, wherein the source vessel comprises an interior cavity, wherein the source vessel is configured to prevent air from entering the interior cavity and maintain a desired pressure in the source vessel.

6. The method of claim 1, wherein the inlet tube is positioned above the maximum fill level.

7. The method of claim 1, wherein the source vessel comprises an interior cavity, wherein the inlet tube extends into the interior cavity by a distance that is 20-40% of a height of the first sidewall.

8. The method of claim 1, wherein the inlet tube comprises a curved shape.

9. The method of claim 1, wherein the sensor is an ultrasonic sensor.

10. The method of claim 1, wherein the sensor is an optical sensor.

11. The method of claim 1, wherein the sensor is an infrared sensor.

12. The method of claim 1, wherein the inlet tube comprises a first portion with a linear shape.

13. The method of claim 12, wherein the inlet tube comprises a second portion comprising the bend.

* * * * *